United States Patent [19]

Fujita et al.

[11] Patent Number: 4,900,716
[45] Date of Patent: Feb. 13, 1990

[54] PROCESS FOR PRODUCING A COMPOUND OXIDE TYPE SUPERCONDUCTING MATERIAL

[75] Inventors: Nobuhiko Fujita; Hideo Itozaki; Saburo Tanaka; Shuji Yazu; Tetsuji Jodai, all of Hyogo, Japan

[73] Assignee: Sumitomo Electric Industries, Ltd., Osaka, Japan

[21] Appl. No.: 195,145

[22] Filed: May 18, 1988

[30] Foreign Application Priority Data

May 18, 1987 [JP] Japan ................................ 62-120819

[51] Int. Cl.$^4$ .......................... B05D 5/12; B05D 3/06
[52] U.S. Cl. .......................................... 505/1; 427/39; 427/62; 423/593; 204/164; 505/742
[58] Field of Search ....................... 427/62, 63, 38, 39; 505/1, 730; 423/593; 204/164

[56] References Cited

U.S. PATENT DOCUMENTS 3,932,315 1/1976 Sleight ................................ 252/521

FOREIGN PATENT DOCUMENTS 60-173885 9/1985 Japan .

OTHER PUBLICATIONS

Magazine Article from Z. Phys. B, dated Apr. 1986, Titled, "Possible High $T_c$ Superconductivity in the Ba—La—Cu—O System", by J. G. Bednorz and K. A. Muller, pp. 189–193.

Landesman et al., "Magnetic and XPS Studies of $YBa_2Cu_3O_{7-\delta}$ Annealed in $O_2$ Plasma", AIP No. 165, Nov. 1987, pp. 389–396.

Tamura et al., "Effects of a Plasma Oxidation of $YBa_2Cu_3O_7$—y Films", Extended Abstracts of ISEC, Aug. 1987, Japan P414.

Maeda et al., "A New High-Tc Oxide Superconductor Without a Rare Earth Element", Jpn. J. Appl. Phys., vol. 27(2), Feb. 1988, L209–210.

Sheng et al., "Superconductivity at 90k in the Tl—Ba—Cu—O System", Phys. Rev. Lett., vol. 60(10), Mar. 1988, pp. 937–940.

Primary Examiner—Norman Morgenstern
Assistant Examiner—Roy V. King
Attorney, Agent, or Firm—Kerkam, Stowell, Kondracki & Clarke

[57] ABSTRACT

The invention is an after-treatment of a compound oxide type superconducting material by oxygen plasma to improve the superconducting property of the material. The treatment by oxygen plasma is performed while the material is heated at 500° to 1,000° C.

The material may have a form of bulky mass or a form of a thin film deposited on a substrate by physical vapor deposition technique.

14 Claims, 1 Drawing Sheet

PROCESS FOR PRODUCING A COMPOUND OXIDE TYPE SUPERCONDUCTING MATERIAL

BACKGROUND OF THE INVENTION

1. Field of the Invention

The present invention relates to a process for manufacturing a superconducting material, more particularly it relates to an after-treatment of a sintered oxide type superconductor.

2. Description of the Related Art

The superconductivity is a phenomenon which is understood as a phenomenon of phase change of electrons under which the electrical resistance become zero and the perfect diamagnetism is observed. If the superconductor is applied to the present power cables which loses 7% of energy, electric current of a very high current density can be delivered without any loss of power. The superconductor can be utilized also on a form of a magnetic coil in the field of power electric applications such as MHD power generation, power transmission, electric power reservation or the like; in the field of transportation such as magnetic levitation trains or magnetically propelling ships; a high sensitive sensors or detectors for sensing very weak magnetic field, microwave, radiant ray or the like, in the medical field such as high-energy beam radiation unit; in the field of science such as NMR or high-energy physics; or in the field of fusion power generation.

In addition to the abovementioned power electric applications, the superconducting materials can be used in the field of electronics, for example, as a Josephson device which is an indispensable switching device for realizing a high-speed computer which consumes very reduced power.

However, the critical temperature could not exceed 23.2K of $Nb_3Ge$ which was the the highest Tc heretofore for all studies for the past ten years.

Possibility of existence of a new type of superconducting materials having much higher Tc was revealed by Bednorz and Muller who discovered a new oxide type superconductor in 1986 [Z. Phys. B64 (1986) 189].

It had been known that certain ceramics material of compound oxides exhibit the property of superconductivity. For example, U.S. Pat. No. 3,932,315 discloses Ba-Pb-Bi type compound oxide which shows superconductivity and Japanese patent laid-open No. 60-173,885 discloses that Ba-Bi type compound oxides also show superconductivity. These type superconductors, however, possess a rather lower transition temperature of about 10K and hence usage of liquidized helium (boiling point of 4.2K) as cryogen is indispensable to realize superconductivity.

This new oxide type superconducting material discovered by Bednorz and Muller is [La, Ba]2CuO4 which is called as the $K_2NiF_4$-type oxide having a crystal structure which is similar to known perovskite type oxide. The $K_2NiF_4$-type oxides show such higher Tc as 30K which are extremely higher than the known superconducting materials.

It was also reported in the news parer that C. W. Chu et al discovered in the United States of America another type of superconducting material having the critical temperature of in the order of 90K in February 1987, and hence possibility of existence of high-temperature superconductors have burst on the scene.

The abovementioned new type superconducting materials are usually produced in a form of bulky mass by sintering technique and in a form of a thin film by physical vapour deposition technique. In most case, the superconducting material produced by these techniques must be further subjected to thermal-treatment in an oxygen containing atmosphere in order to improve their property as superconductivity.

However, even after the thermal-treatment, the superconducting property of the oxide type superconductors is not stable and also the discrepancy ($\Delta T$) between the onset temperature and the critical temperature can not be decreased.

Therefore, an object of the present invention is to overcome the abovementioned problems of the conventional technique and to provide a novel process for producing an improved superconducting material which has high Tc and high stability.

SUMMARY OF THE INVENTION

The present invention provides an improvement in a process for producing a compound oxide type superconductor, characterized in that a compound oxide type superconducting material is treated in oxygen plasma.

The oxygen plasma can be produced by the conventional oxygen plasma reactor or generator, such as high-frequency plasma reactor.

The present inventors found such fact that a thin film deposited on a substrate by physical vapour deposition technique and then heat-treated in the oxygen containing atmosphere does not contain satisfactory oxygen atoms therein so that the film obtained can not possess a desired crystal structure of oxygen deficiency which is a critical factor for realizing the high Tc superconductivity. Therefore, it is necessary to introduce oxygen atoms into the thin film deposited. The present invention was completed from such finding.

The oxygen plasma is not thermally activated oxygen gas used in the conventional heat-treatment in oxygen gas atmosphere but have much activated or excited energy level so that oxygen atoms can penetrate into the crystal structure of the compound oxide, resulting in that the desired oxygen contents can be realized.

The treatment by oxygen plasma may be carried at any temperature, but it is preferable to heat the compound oxide to be treated at an elevated temperature. In fact, if the compound oxide is heated, the oxygen atoms doped into the compound oxide are diffused in the compound oxide to produce a homogeneous structure and to increase the oxygen contents. The compound oxide is preferably heated at a temperature ranging from 500° C. to 1,000° C.

The treated compound oxide is preferably cooled down slowly in the same atmosphere of oxygen plasma after the treatment by oxygen plasma complete at a cooling speed of less than 10° C./min. This slow cooling or annealing ensure that the doped oxygen is fixed in the crystal structure to realize a condition of oxygen rich.

The present invention is applicable to any compound oxide, particularly those that are difficult to realize the ideal crystal structure by the conventional technique and also is advantageously applicable to such compound oxides that can not exhibit satisfactory superconductivity due to imperfect condition during their manufacturing stage. Namely, the present invention permits to supplement them with additional oxygen so that they can be changed to satisfactory superconductors.

The compound oxide to which the present invention is applicable includes oxide type ceramics such as Y-Ba- Cu-O system, La-Ba-Cu-O system and La-Sr-Cu-O system. More generally, they belong to compound oxides including an element α selected from IIa group of the Periodic Table, an element β selected from IIIa group of the Periodic Table and copper (Cu). These constituent elements can be substituted partially by at least one of elements selected from a group comprising Al, Fe, Co, Ni, Zn, Ag and Ti.

Selection of an atomic ratio of α to β depend on combination of elements. For example, in cases of Ba-Y system, Ba-La system and Sr-La system, the following ratios are preferable:

Y/(Ba+Y) system: 0.06 to 0.94, preferably 0.1 to 0.4
Ba/(Ba+La) system: 0.04 to 0.96, preferably 0.08 to 0.45
Sr/(La+Sr) system: 0.03-0.95, preferably 0.05-0.1

When the atom ratios are not within the abovementioned range, high Tc can not be observed because the optimum conditions of crystal structure and oxygen deficiency can not be obtained.

The element α selected from IIa group of the Periodic Table is preferably Ba or Sr. The element β selected from IIIa group of the Periodic Table is preferably Y, La, Gd, Dy, Ho, Er, Tm, Yb, Nd, Sm or Eu or combinations of these elements.

The compound oxide can be produced by the conventional technique such as sintering or physical vapour deposition such as sputtering. When the compound oxide to be treated by the present invention takes a form of a bulky mass, it can be prepared by sintering directly or through a preliminarily sintering stage a powder mixture of oxide and/or carbonate of constituent elements of said compound oxide. If necessary, binder may be added to the powder mixture to produce a paste which is sintered later.

Selection of the sintering temperature and the preliminary sintering temperature depend on combinations of elements. In case of the abovementioned special combinations, they can be selected from the following range:

| system | Preliminary sintering temp. | Final sintering temp. |
|---|---|---|
| Ba—Y | from 250 to 1,200° C. | from 700 to 1,500° C. |
| Ba—La | from 220 to 1,230° C. | from 650 to 1,580° C. |
| Sr—La | from 234 to 1,260° C. | from 680 to 1,530° C. |

The physical vapour deposition can be carried out by using the abovementioned compound oxide as a target.

The present invention is applicable to the compound oxide obtained by the abovementioned conventional technique.

The product treated by the process of the present invention from the abovementioned material of compound oxide is a compound oxide represented by the formula:

$$(\alpha_{1-x}\beta_x)Cu_yO_z$$

in which α and β means the same definition as above, x is an atomic ratio of β with respect to (α+β) having a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respectively, and a compound oxide represented by the formula:

in which Ln stands for at least one of elements selected from a group comprising Y, La, Gd, Dy, Ho, Er, Tm, Tb, Lu, Nd, Sm and Eu, and δ is a number which satisfies a range of $0 < \delta < 1$ and includes the following special systems:

| | | |
|---|---|---|
| $Y_1Ba_2Cu_3O_{7-x}$, | $Ho_1Ba_2Cu_3O_{7-x}$, | $Lu_1Ba_2Cu_3O_{7-x}$, |
| $Sm_1Ba_2Cu_3O_{7-x}$, | $Nd_1Ba_2Cu_3O_{7-x}$, | $Gd_1Ba_2Cu_3O_{7-x}$, |
| $Eu_1Ba_2Cu_3O_{7-x}$, | $Er_1Ba_2Cu_3O_{7-x}$, | $Dy_1Ba_2Cu_3O_{7-x}$, |
| $Tm_1Ba_2Cu_3O_{7-x}$, | $Yb_1Ba_2Cu_3O_{7-x}$, | $La_1Ba_2Cu_3O_{7-x}$, |
| $(La, Sr)_2CuO_{4-x}$ | $(La, Ba)_2CuO_{4-x}$ | | in which x is a number which satisfies a range of $0 < x < 1$.

The abovementioned oxides possess preferably perovskite type or quasi-perovskite type crystal structure. The term of quasi-perovskite type means a structure which can be considered to have such a crystal structure that is similar to Perovskite-type oxides and includes an orthorhombically distorted perovskite or a distorted oxygen-deficient perovskite or the like.

The present invention can produce further the other types of compound oxides including the following system:

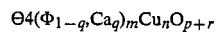

in which Θ stands for Bi or Tl, Φ stands for Sr when Θ is Bi and stands for Ba when Θ is Tl, m and n are numbers each satisfying ranges of $6 \leq m \leq 10$ and $4 \leq n \leq 8$ respectively, $p = (12 + 2m + 2n)/2$, q is a number which satisfies a range of $0 < q < 1$, and r is a number which satisfies a range of $-2 \leq r \leq +2$. This system is considered to be a single phase of the following compound oxide or a mixed phase consisting mainly thereof:

| | |
|---|---|
| $Bi_4Sr_4Ca_4Cu_6O_{20-r}$, | $Bi_2Sr_2Ca_2Cu_3O_{10-r}$, |
| $Tl_4Ba_4Ca_4Cu_6O_{20-r}$, | $Tl_2Ba_2Ca_2Cu_3O_{10-r}$, | in which r is a number which satisfies a range of $-2 \leq r \leq +2$.

Now, the present invention will be described with reference to attached drawings which illustrate an apparatus used for carrying out the present invention.

Figure 1:
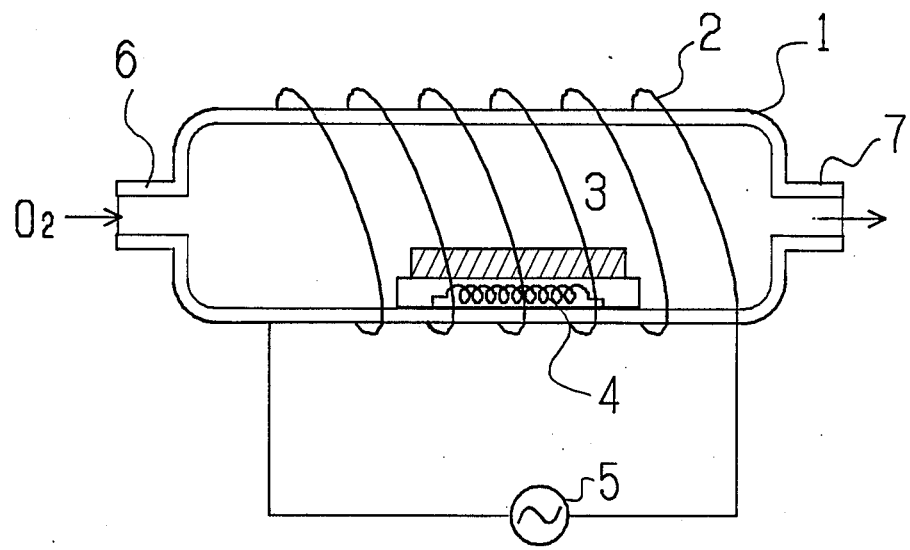
FIG. 1 is an illustrative view of a RF (radio-frequency) type plasma reactor which can be used in the present invention.

The apparatus shown in FIG. 1 includes a chamber 1, a high-frequency coil 2 mounted on the chamber 1 and a heater 4 for heating a material oxide 3 placed in the chamber 1. The chamber 1 is connected to a vacuum pump (not shown) through a port 7 for creating vacuum in the chamber 1. Oxygen gas is introduced through a port 6.

In operation, a compound oxide 3 is placed in the chamber and vacuum is created in the chamber 1. Then, oxygen gas is fed through the port 6 and the high-frequency coil 2 is energized. The heater 4 is actuated when the compound oxide required to be treated in a heated condition.

Now, the process according to the present invention will be described with reference to illustrative Examples which are carried out in the apparatus shown in FIG. 1, but the scope of the present invention should not be limited thereto.

EXAMPLE 1

In this example, a sintered powder block was used as a compound oxide.

At first, powders of $Y_2O_3$ and $BaCO_3$ were mixed at an atom ratio of Y:Ba-1:2 and then a powder of CuO was added to the resulting powder mixture at an atom ratio of Y:Ba:Cu=1:2:3. Then, the resulting powder mixture was sintered preliminarily at 880° C. and then further sintered finally at 940° C. to obtain a sintered block of $YBa_2Cu_3O_7$ having a dimension of 20×30×3 mm.

After the block was placed in the chamber, the pressure in the chamber 1 was reduced to $10^{-6}$ Torr, oxygen gas of 0.1 Torr was introduced in the chamber. Then, the high-frequency coil is energized at a power of 150 W and the block was heated gradually at a rate of 15° C./min to a temperature of 900° C. by the heater. After the block was left under this temperature for 3 hours, the block was cooled slowly at a cooling rate of 8° C./min (Sample A).

For comparison, the same procedure as above was repeated except that the high-frequency coil is not energized but the block was treated only in an oxygen atmosphere 760 Torr (Sample B).

Electrodes are vacuum-deposited on opposite ends of the block treated to measure resistance of the resulting block. Tc (critical temperature) and Tcf (a temperature where complete zero resistance is realized) measured on the resulting treated block are shown in Table 1.

EXAMPLE 2

The same procedure as Example 1 was repeated except that powders of $Bi_2O_3$, CaO, $SrCO_3$ and CuO were mixed at an atom ratio of Bi:Ca:Sr:Cu=2:2:2:3 and then sintered at 880° C. to obtain a sintered block of $Bi_4Sr_4Ca_4Cu_6O_{20}$.

Oxygen plasma treatment was carried out on this block in the same manner as Example 1 (Sample A).

For comparison, the same procedure as above was repeated except that the high-frequency coil is not energized but the block was treated only in an oxygen atmosphere 760 Torr (Sample B).

The conditions of treatment and the result of Tc and Tcf measured is shown in Table 1.

EXAMPLE 3

As material powders, powders of $La_2O_3$ and $BaCO_3$ were mixed at an atom ratio of La:Ba=95:5 and then a powder of CuO was added to the resulting powder mixture at an atom ratio of La:Ba:Cu=95:5: 200. Then, the resulting powder mixture was sintered preliminarily at 870° C. and then further sintered finally at 955° C. to obtain a sintered block of $(La,Ba)Cu_2O_3$.

The same oxygen plasma treatment as Example 1 was repeated (Sample A).

For comparison, the same procedure as above was repeated except that the high-frequency coil is not energized but the block was treated only in an oxygen atmosphere 760 Torr (Sample B).

The conditions of treatment and the result of Tc and Tcf measured is shown in Table 1.

EXAMPLE 4

A material powder of $BaCO_3$ in Example 3 is displaced by $SrCO_3$ and the same procedure as Example 3 was repeated to obtain a sintered block of $(La,Sr)Cu_2O_3$ The same oxygen plasma treatment as Example 1 was repeated (Sample A).

For comparison, the same procedure as above was repeated except that the high-frequency coil is not energized but the block was treated only in an oxygen atmosphere 760 Torr (Sample B).

The conditions of treatment and the result of Tc and Tcf measured is shown in Table 1.

EXAMPLE 5

A thin film of the compound oxide obtained in Example 1 was deposited on a substrate made of $SrTiO_3$ in an ordinary sputtering machine by using the block prepared in Example 1 as a target.

The oxygen plasma treatment according to the present invention (Sample A) and the conventional heat-treatment in oxygen gas of 760 Torr (Sample B) were repeated in the same manner as Example 1.

The conditions of treatment and the result of Tc and Tcf measured is shown in Table 1.

EXAMPLE 6

A block of sintered powder was produced by the same procedure as Example 1 except that the powder mixture was sintered simply once at 840° C. The block did not show any superconducting property Then, the block was treated in the apparatus shown in FIG. 1 with oxygen plasma under an oxygen pressure of $10^{-1}$ torr at a high-frequency power of 150 W. The other condition is shown in FIG. 1 with the result of measurement of Tc and Tcf.

This example shows that a compound oxide which do not possess superconducting property can be changed to a proper superconductor by the present invention.

TABLE 1

| Ex. No. | | $O_2$ pressure (Torr) | Condition of oxygen plasma treatment | | | | Tc (K) | Tcf (K) |
|---|---|---|---|---|---|---|---|---|
| | | | RF power (W) | Substrate temp. (°C.) | Heating rate (°C./min) | Cooling rate (°C./min) | | |
| 1 | A | $1 \times 10^{-1}$ | 150 | 900 | 15 | 8 | 113 | 105 |
| | B | 760 | — | 900 | 15 | 8 | 82 | 51 |
| 2 | A | 1 | 100 | 400 | 10 | 10 | 98 | 95 |
| | B | 760 | — | 400 | 10 | 10 | 80 | 40 |
| 3 | A | $2 \times 10^{-1}$ | 150 | 1,000 | 15 | 150 | 98 | 90 |
| | B | 760 | — | 1,000 | 15 | 150 | 76 | 39 |
| 4 | A | $1 \times 10^{-1}$ | 150 | 1,050 | 15 | 8 | 106 | 99 |
| | B | 760 | — | 1,050 | 15 | 8 | 63 | 24 |
| 5 | A | $7 \times 10^{-2}$ | 150 | 800 | 15 | 8 | 101 | 92 |
| | B | 760 | — | 800 | 15 | 8 | 65 | 12 |
| 6 | | $1 \times 10^{-1}$ | 150 | 900 | 15 | 8 | 91 | 82 |

What we claim is:

1. Improvement in a process for producing a compound oxide type superconducting material, characterized in that the compound oxide type superconducting material is treated in oxygen plasma while the compound oxide type superconducting material is heated at a temperature ranging from 500° to 1000° C.

2. Method set forth in claim 1, characterized in that, after the treatment by oxygen plasma is complete, the treated material is cooled down slowly in the oxygen plasma.

3. Method set forth in claim 1, characterized in that said treated material is cooled down at a cooling speed of less than 10° C./min.

4. Method set forth in claim 1, characterized in that said compound oxide type superconducting material is in a form of a thin film deposited on a substrate.

5. Method set forth in claim 1, characterized in that said compound oxide type superconducting material is a compound oxide containing an element $\alpha$ selected from IIa group of the periodic table, an element $\beta$ selected from IIIb group of the periodic table and copper (Cu).

6. Method set forth in claim 5, characterized in that said compound oxide have the general formula:

$$(\alpha_{1-x}\beta_x)Cu_yO_z$$

in which $\alpha$ and $\beta$ means the same definition as above, x is an atomic ratio of $\beta$ with respect to $(\alpha+\beta)$ having a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respectively.

7. Method set forth in claim 5, characterized in that said compound oxide have the general formula:

$$Ln_{1-x}Ba_xCu_3O_{7-\delta}$$

in which Ln stands for at least one of elements selected from a group comprising Y, La, Gd, Dy, Ho, Er, Tm, Tb, Lu, Nd, Sm and Eu, and $\delta$ is a number which satisfies a range of $0 < \delta < 1$.

8. Method set forth in claim 5, characterized in that said compound oxide type superconducting material possesses perovskite type or quasi-perovskite type crystal structure.

9. Method set forth in claim 5, characterized in that said compound oxide type superconducting material is in a form of a bulky sintered mass prepared by sintering preliminarily a powder mixture of oxides and/or carbonates containing constituent elements of said superconductor at a temperature ranging from 220° to 1,260° C.

10. Method set forth in claim 9, characterized in that said compound oxide type superconducting material is in a form of a bulky sintered mass prepared by sintering preliminarily a powder mixture of oxides and/or carbonates containing constituent elements of said superconductor at a temperature ranging from 220° to 1,260° C. and then by sintering finally the preliminarily sintered mass at a temperature ranging from 650° to 1,580° C.

11. Method set forth in claim 5, characterized in that said compound oxide type superconducting material is in a form of a thin film which is deposited on a substrate by physical vapour deposition technique in which said preliminarily sintered mass is used as a vapour source.

12. Method set forth in claim 5, characterized in that said compound oxide type superconducting material is in a form of a thin film which is deposited on a substrate by physical vapour deposition technique in which said finally sintered mass is used as a vapour source.

13. Method set forth in claim 1, characterized in that said compound oxide have the general formula:

$$\Theta 4(\Phi_{1-q}Ca_q)_m Cu_n O_{p+r}$$

in which $\Theta$ is Bi or Tl, $\Theta$ is Sr when $\Theta$ is Bi and is Ba when $\Theta$ is Tl, m and n are numbers each satisfying ranges of $6 \leq m \leq 10$ and $4 \leq n \leq 8$ respectively, $p = (12+2m+2n)/2$, q is a number which satisfies a range of $0 < q < 1$, and r is a number which satisfies a range of $-2 \leq r \leq +2$.

14. Process for producing a compound oxide type superconducting material by selecting a compound oxide from a group consisting of (i) compound oxides containing an element $\alpha$ selected from IIa group of the periodic table, an element $\beta$ selected from IIIb group of the periodic table and copper (Cu) and (ii) compound oxides have the general formula:

$$\Theta 4(\Phi_{1-q}Ca_q)_m Cu_n O_{p-r}$$

in which $\Theta$ is bi or Tl, $\Phi$ is Sr when $\Theta$ is Bi and is Ba when $\Theta$ is Tl, m and n are numbers each satisfying respective ranges of $6 \leq m \leq 10$ and $4 \leq n \leq 8$, $p = (12+2m+2n)/2$, q is a number which satisfies a range of $0 < q < 1$ and r is a number which satisfies a range of $-2 \leq r \leq +2$, and preparing the compound oxide type superconducting material which was selected in a form of a thin film or a bulk form and treated in oxygen plasma while the compound oxide type superconducting material is heated at a temperature ranging from 500° to 1000° C.

* * * * *

UNITED STATES PATENT AND TRADEMARK OFFICE
CERTIFICATE OF CORRECTION

PATENT NO. : 4,900,716

DATED : February 13, 1990

INVENTOR(S) : Fujita et al

It is certified that error appears in the above-identified patent and that said Letters Patent is hereby corrected as shown below:

Column 7, line 9, Claim 2, change "complete" to -- completed --.

Column 8, line 41, Claim 14, change "p-r" to -- p+r --.

Column 8, line 43, Claim 14, change "bi" to -- Bi --.

Signed and Sealed this

Nineteenth Day of February, 1991

Attest:

HARRY F. MANBECK, JR.

*Attesting Officer*      *Commissioner of Patents and Trademarks*